(12) United States Patent
Sandström et al.

(10) Patent No.: US 6,819,490 B2
(45) Date of Patent: Nov. 16, 2004

(54) HOMOGENIZATION OF A SPATIALLY COHERENT RADIATION BEAM AND PRINTING AND INSPECTION, RESPECTIVELY, OF A PATTERN ON A WORKPIECE

(75) Inventors: Torbjörn Sandström, Pixbo (SE); Anna-Karin Holmér, Pixbo (SE); Kenneth Wilhelmsson, Partille (SE)

(73) Assignee: Micronic Laser Systems AB, Taby (SE)

( * ) Notice: Subject to any disclaimer, the term of this patent is extended or adjusted under 35 U.S.C. 154(b) by 93 days.

(21) Appl. No.: 10/238,177

(22) Filed: Sep. 10, 2002

(65) Prior Publication Data

US 2003/0071204 A1 Apr. 17, 2003

Related U.S. Application Data

(60) Provisional application No. 60/322,386, filed on Sep. 11, 2001.

(30) Foreign Application Priority Data

Sep. 10, 2001 (SE) ............................................. 0103006

(51) Int. Cl.[7] .......................... G02B 27/44; G02B 5/18
(52) U.S. Cl. ...................... 359/566; 357/572; 357/619; 357/565; 355/53; 355/67
(58) Field of Search .................................. 359/566, 569, 359/572, 15; 355/67, 53; 250/237 G (56) References Cited

U.S. PATENT DOCUMENTS

| | | | |
|---|---|---|---|
| 3,754,814 A | * 8/1973 | Leith | ........................... 359/599 |
| 3,802,762 A | * 4/1974 | Kiemle | ........................ 708/816 |
| 4,475,027 A | 10/1984 | Pressley | |
| 4,819,033 A | 4/1989 | Yoshitake et al. | |
| 5,056,039 A | 10/1991 | Caulfield | |
| 5,414,559 A | * 5/1995 | Burghardt et al. | ........... 359/623 |
| 5,495,280 A | 2/1996 | Gehner et al. | |
| 6,002,520 A | * 12/1999 | Hoch et al. | .................. 359/565 |
| 6,067,306 A | 5/2000 | Sandstrom et al. | |
| 6,069,739 A | 5/2000 | Borodovsky et al. | |
| 6,163,403 A | 12/2000 | Carrott et al. | |
| 6,169,634 B1 | * 1/2001 | Sirat | ........................... 359/641 |
| 2002/0159044 A1 | 10/2002 | Mei et al. | |

FOREIGN PATENT DOCUMENTS

| WO | WO 99/45439 | 9/1999 |
|---|---|---|
| WO | WO 02/057851 A1 | 7/2002 |

OTHER PUBLICATIONS

P. Kruit, "High Throughput Electron Lithography with the Multiple Aperture Pixel by Pixel Enchancement of Resolution Concept," J. Vac. Sci. Technol. B. 16(6), Nov./Dec. 1998, pp. 3177–3180.

* cited by examiner

*Primary Examiner*—Leo Boutsikaris
(74) *Attorney, Agent, or Firm*—Ernest J. Beffel, Jr.; Haynes Beffel & Wolfeld LLP (57) ABSTRACT

The present invention relates to a device for homogenizing the spatial intensity distribution of a spatially coherent radiation beam. The device includes a grating arranged in the propagation path of a spatially coherent radiation beam for diffracting the coherent beam and thus decreasing the coherence length of a diffracted radiation beam in a direction orthogonal to the propagation direction of the radiation beam relative to the width of the radiation beam in the orthogonal direction; and a radiation splitting and directing arrangement arranged in the propagation path of the diffracted radiation beam for splitting the diffracted radiation beam into spatially separated portions and for superimposing the spatially separated portions to form a radiation beam having a homogenized spatial intensity distribution.

26 Claims, 7 Drawing Sheets

HOMOGENIZATION OF A SPATIALLY COHERENT RADIATION BEAM AND PRINTING AND INSPECTION, RESPECTIVELY, OF A PATTERN ON A WORKPIECE

PRIORITY CLAIM

This application claims the benefit of Provisional Application No. 60/322,386, filed Sep. 11, 2001 entitled Homogenization of a Spatially Coherent Radiation Beam and Reading/Writing of a Pattern on a Workpiece, invented by Torbjörn Sandström.

This application further claims priority under 35 U.S.C. § 119 of Swedish National Application No. 0103006-3, filed Sep. 10, 2001, entitled Homogenization of a Spatially Coherent Radiation Beam and Reading/Writing of a Pattern on a Workpiece.

TECHNICAL FIELD

The present invention relates in general to homogenization of the spatial intensity distributions of spatially coherent radiation beams. It also relates to high precision printing of patterns on photosensitive surfaces of workpieces, such as photomasks for semiconductor devices and displays. The invention also applies to illumination of workpieces for reading back a pattern for inspection of patterns or surface defects.

DESCRIPTION OF THE BACKGROUND ART

It is known in the current art to build precision pattern generators using projection of micromirror spatial light modulators (SLM's) of the micromirror type (Nelson 1988, Kuck 1990). The use of an SLM in a pattern generator has a number of advantages compared to the more wide-spread method of using scanning laser spots: the SLM is a massively parallel device and the number of pixels that can be written per second is extremely high.

Figure 1:
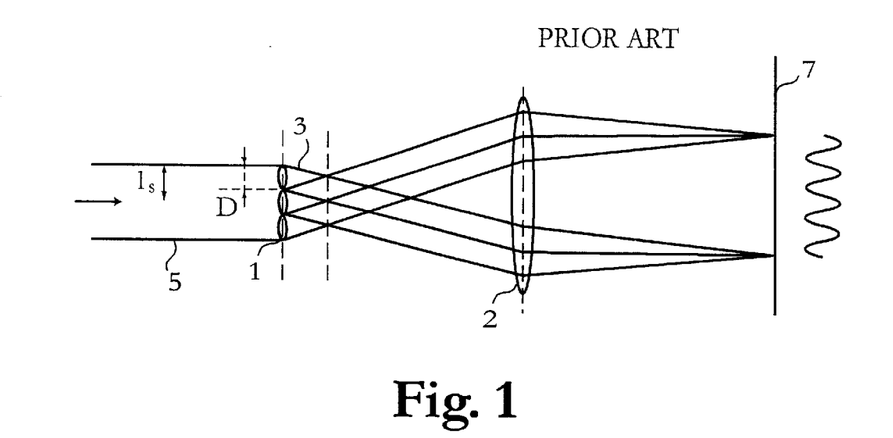
FIG. 1 illustrates, schematically, in a top view, a radiation beam homogenizer according to prior art.

Such a generator often uses an excimer laser as a light source, and typically the radiation output from the laser is passed a radiation beam-scrambling illuminator to distribute the light intensity uniformly over the SLM surface. The illuminator includes a beam homogenizer, which is schematically illustrated in FIG. 1. The homogenizer consists of a lens system containing an array of lenses 1, each of which together with an imaging lens 2 distribute a respective transversely separated portion 3 of the laser beam 5 over the SLM surface 7 to thereby provide for a uniform integrated illumination of the SLM surface 7. The more lenses used in the array 3, the more uniform illumination of the SLM surface 7 is achieved.

One important limitation in this respect is the spatial coherence of the laser source. An excimer laser is known to have a temporal coherence length and a spatial coherence length, i.e. coherence length across the laser beam profile. Some lasers may even be spatially coherent over their entire beam width or at least over a major portion thereof. The temporal coherence length depends on the laser design and may be e.g. 0.15 mm. For books on coherence see Born & Wolf, Principles of Optics; Siegman, Lasers; and Goodman, Statistical Optics.

When the width D of the lenses in array 3 is smaller than the spatial coherence length $l_s$ of the laser source, light bundles from adjacent lenses 3 are obviously coherent, and as a consequence these light bundles may interfere with each other and produce an interference pattern in the illumination of the SLM surface 7 as schematically indicated by the "top hat" light distribution with fringes to the right of SLM surface 7 in FIG. 1.

The spatial coherence length of the laser beam obviously puts a limitation on the number of lenses that can be used in the homogenizer, and thus on the quality of homogenization. The relative coherence length as a fraction of the beam diameter is an invariant of the beam when it is expanded.

SUMMARY OF THE INVENTION

Accordingly, it is an object of the present invention to provide a device for homogenizing the spatial intensity distribution of a spatially coherent radiation beam, which overcomes the above-mentioned problem of interference pattern or poor homogenization of the radiation beam.

This object, among others, is according to a first aspect of the invention attained by a device, which comprises a grating and a radiation splitting and directing arrangement. The grating is arranged in the propagation path of the spatially coherent radiation beam for diffracting the coherent beam and thus decreasing the coherence length of a diffracted radiation beam in a direction orthogonal to the propagation direction of the radiation beam relative to the width of the radiation beam in that orthogonal direction. The radiation splitting and directing arrangement is arranged in the propagation path of the diffracted radiation beam for splitting the diffracted radiation beam into spatially separated portions and for superimposing the spatially separated portions to thereby form a radiation beam having a homogenized spatial intensity distribution.

Preferably, the spatially separated portions have each a cross-sectional width, which is shorter than the original spatial coherence length of the radiation beam, but longer, preferably much longer, than the spatial coherence length of the diffracted radiation beam in the orthogonal direction, to thereby prevent adjacent portions from interfering with each other while being superimposed.

The coherent radiation beam may be temporally coherent and then have a temporal coherence length, which is shorter, or much shorter, then its spatial coherence length. This condition can in a practical case be created by expansion of the beam.

The grating may be a transmission or a reflection grating, and may in the latter case be arranged in Littrow configuration. Alternatively, if the radiation beam has a rectangular cross section, the grating may be arranged to magnify the radiation beam in one direction to obtain a diffracted radiation beam of a substantially quadratic cross section.

The splitting and directing arrangement may include one or several array of lenses, preferably cylindrical lenses, each of which focuses a respective one of the spatially separated portions, and a lens arrangement for imaging the spatially separated portions onto each other.

Further objects of the present invention are to provide a radiation beam conditioning device and an apparatus for high precision printing of a surface pattern on a photosensitive surface of a workpiece, particularly a photomask for semiconductor devices and displays, which make use of the device according to the first aspect of the invention. The lenses can be refractive, reflective or diffractive.

Thus, according to a second aspect of the present invention there is provided a radiation beam conditioning device for use in an apparatus for high precision printing or inspection of a surface pattern on a photosensitive surface of a workpiece, particularly a photomask for semiconductor devices and displays, using a spatially coherent radiation beam. The conditioning device comprises a radiation beam homogenizer according to the first aspect of the invention for homogenizing the spatial intensity distribution of the spatially coherent radiation beam.

Further, according to a third aspect of the invention there is provided an apparatus for high precision printing or inspection of a surface pattern on a photosensitive surface of a workpiece, particularly a photomask for semiconductor devices and displays. The apparatus comprises a source for emitting a spatially coherent radiation beam; a radiation beam conditioning device for shaping and homogenizing the spatial intensity distribution of the radiation beam; a spatial light modulator having multitude of modulating elements, illuminated by the conditioned radiation beam; and a projection system for creating an image of the spatial light modulator on the photosensitive surface of the workpiece. In the case of inspection there is an imaging capturing device such as a CCD, CID or MOS camera. The radiation beam-conditioning device includes the device according to the first aspect of the invention for homogenizing the spatial intensity distribution of the spatially coherent radiation beam.

Still further objects of the present invention are to provide a method for homogenizing the spatial intensity distribution of a spatially coherent radiation beam, which overcomes the problem of interference pattern or poor homogenization of the radiation beam, and to provide a method for high precision printing or inspection of a surface pattern on a photosensitive surface of a workpiece, particularly a photomask for semiconductor devices and displays, which makes use of the homogenizing method.

Thus, according to a fourth aspect of the present invention there is provided a method for homogenizing the spatial intensity distribution of a spatially coherent radiation beam, comprising the actions of: (i) diffracting the coherent beam and thus decreasing the coherence length of a diffracted radiation beam in a direction orthogonal to the propagation direction of the radiation beam relative to the width of the radiation beam in that orthogonal direction; (ii) splitting the diffracted radiation beam into spatially separated portions; and (iii) superimposing the spatially separated portions to thereby form a radiation beam having a homogenized spatial intensity distribution.

According to a fifth aspect of the invention there is provided a method for high precision printing or inspection of a surface pattern on a photosensitive surface of a workpiece, particularly a photomask for semiconductor devices and displays, which method comprises the actions of: (i) emitting a spatially coherent radiation beam; (ii) homogenizing the spatial intensity distribution of the radiation beam; (iii) illuminating a spatial light modulator having multitude of modulating elements with the homogenized radiation beam; and (iv) creating an image of the spatial light modulator on the photosensitive surface of the workpiece by means of a projection system. The step of homogenizing is performed in accordance with the fourth aspect of the invention.

Further, according to a sixth aspect of the invention there is provided a device for homogenizing the spatial intensity distribution of a spatially coherent radiation beam comprising a deflection device arranged in the propagation path of the spatially coherent radiation beam to deflect the coherent beam and thus decrease a spatial coherence length of a deflected radiation beam in a direction orthogonal to the propagation direction of the radiation beam relative to the width of the radiation beam in said orthogonal direction; and a radiation splitting and directing arrangement arranged in the propagation path of said deflected radiation beam to split the deflected radiation beam into spatially separated portions and to superimpose said spatially separated portions to thereby form a radiation beam having a homogenized spatial intensity distribution.

The deflecting device is preferably a segmented mirror, i.e. micro mirror array, or it may be realized by refractive optics.

Further, the deflecting device may be two-dimensional to reduce the spatial coherence length in two orthogonal directions across the beam simultaneously.

Further characteristics of the invention, and advantages thereof, will be evident from the detailed description of preferred embodiments of the present invention given hereinafter and the accompanying FIGS. 2–8, which are given by way of illustration only, and thus are not limitative of the present invention.

DETAILED DESCRIPTION OF PREFERRED EMBODIMENTS

Figure 2:
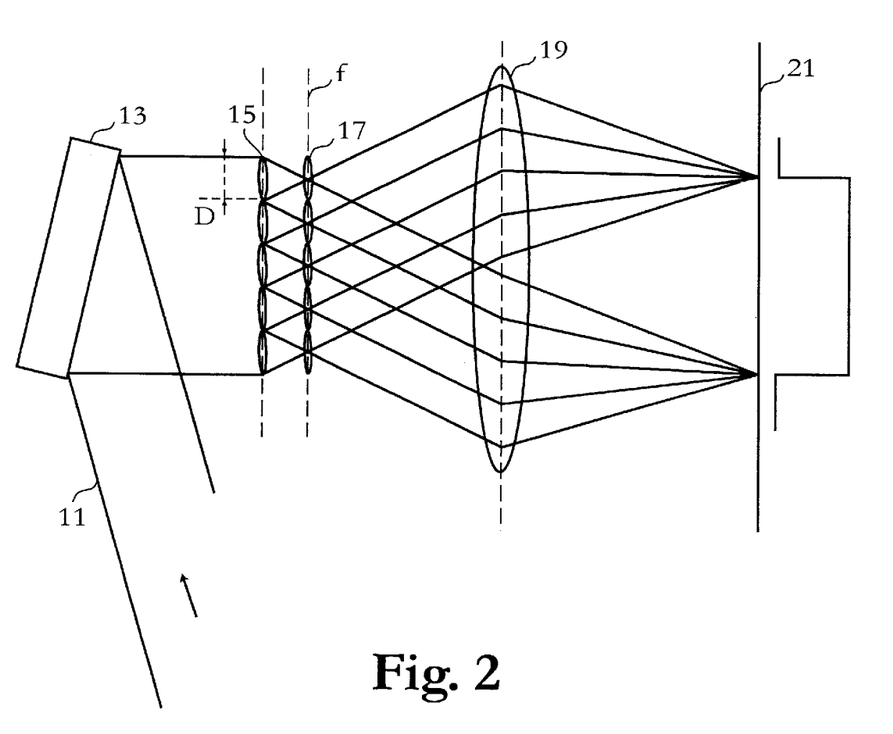
FIG. 2 illustrates, schematically, in a top view, a device for homogenizing a spatially coherent radiation beam according to a preferred embodiment of the present invention.

FIG. 2 shows in a schematic top view a first embodiment of a device for homogenizing a spatially coherent radiation beam 11 according to the present invention.

The spatially coherent radiation beam 11 originates from a source of radiation, which typically is an excimer laser producing a broadband laser beam of a rectangular cross-section, e.g. 3 mm×6 mm. The temporal coherence properties of such a laser is determined by the spectral linewidth $\Delta v$ of the laser according to $$l_t = c/\Delta v \qquad (1)$$

where $l_t$ is the temporal coherence length and c is the speed of light. The spatial coherence length $l_s$, i.e. the coherence length across the laser beam, may typically be longer, or much longer, than the temporal coherence length. Further, the spatial coherence properties may be different in orthogonal directions across the beam. As an example a broadband laser may have a temporal coherence length $l_s$ of about 0.1 mm and a spatial coherence length $l_s$ of about 1.5 mm in one direction and 0.3 mm in the other direction for the unexpanded beam.

The present invention is applicable to situations where the spatial coherence length is longer than the temporal coherence length, and it will be demonstrated that by the present invention the coherence length across the laser beam (i.e. orthogonal to the propagation direction) can be reduced to about the same magnitude as the temporal coherence length.

The inventive device for homogenizing comprises a diffraction grating 13, first 15 and second 17 two-dimensional arrays of lenses or lenslet arrays, and an imaging lens 19.

The diffraction grating 13 is arranged in the path of a spatially coherent radiation beam 11 to diffract it, and the radiation beam diffracted (preferably the $1^{st}$ order diffraction) is then homogenized by means of lenses 15, 17 and 19.

The purpose of the grating is to introduce a differential propagation lag or delay across the beam of the laser, and thus to tilt the spatial coherence length out of the plane orthogonal to the propagation direction of the diffracted laser beam. The coherence length of diffracted laser beam in the plane orthogonal to the propagation direction of the diffracted laser beam can be viewed as the projection of the spatial coherence length onto said plane. Details of differential propagation lag will be discussed below with reference to FIGS. 3 and 4.

The first array of lenses 15 is arranged in the path of the diffracted laser beam 11 to divide the beam into spatially separated portions or beamlets (i.e. separated in the plane orthogonal to the propagation direction of the diffracted laser beam), which are each focused at a respective focal spot in a focal plane f. The imaging lens 19 will then image the spatially separated, and individually focused, portions onto each other in an image plane 21. In such manner a radiation beam is formed, which has a homogenized spatial intensity distribution.

As the diffraction grating reduces the spatial coherence length across the laser beam, more lenses in array 15 can be used without causing interference between adjacent ones of the separated beam portions, and as a result a more uniform intensity distribution of the beam in the image plane 21 is achieved. By strong coherence length reduction and by using a large array of lenses almost a smooth "top-hat" light distribution is obtained as schematically indicated in FIG. 2 by the intensity profile to the right of the image plane 21. As an example the array may house 10×10 lenses.

Preferably, lenses of array 15 have each a width D, which is shorter than the spatial coherence length $l_s$ of the radiation beam, but longer, preferably much longer, than the coherence length of the diffracted radiation beam in said orthogonal direction, to thereby prevent adjacent portions from interfering with each other while being superimposed.

The purpose of the second array of lenses 17 is to avoid diffraction patterns from the edges of the lenses of the first array 15 and to make the edges of the illuminated area sharper, so that an almost ideal flat-illuminated area is created. The second array of lenses 17 is placed near the focal plane f of the first lens array 15 and images the first lens array 15 onto the image plane 21.

The lens arrays 15 and 17 may comprise spherical lenses, but in an alternative preferred version of the invention arrays 15 and 17 comprise cylindrical lenses oriented to refract the respective beamlets in a horizontal direction and homogenize the laser beam in that direction. To achieve beam homogenization in the vertical direction as well, a pair of arrays of cylindrical lenses is inserted into the propagation path of the laser beam 11, which refract the beam only in the vertical direction (not illustrated). Possibly a further imaging lens (neither illustrated) is used for the imaging of the beamlets onto the image plane 21. Lens arrays of different focal lengths for the horizontal and vertical refraction, respectively, are used and thus the size of the laser beam can be controlled in a flexible manner, i.e. the height and width of the laser beam are individually controllable.

The design of the homogenizing lens arrangement may be achieved in a plurality of ways readily apparent to the optical designer, and such design will not be treated further herein.

Figure 3:
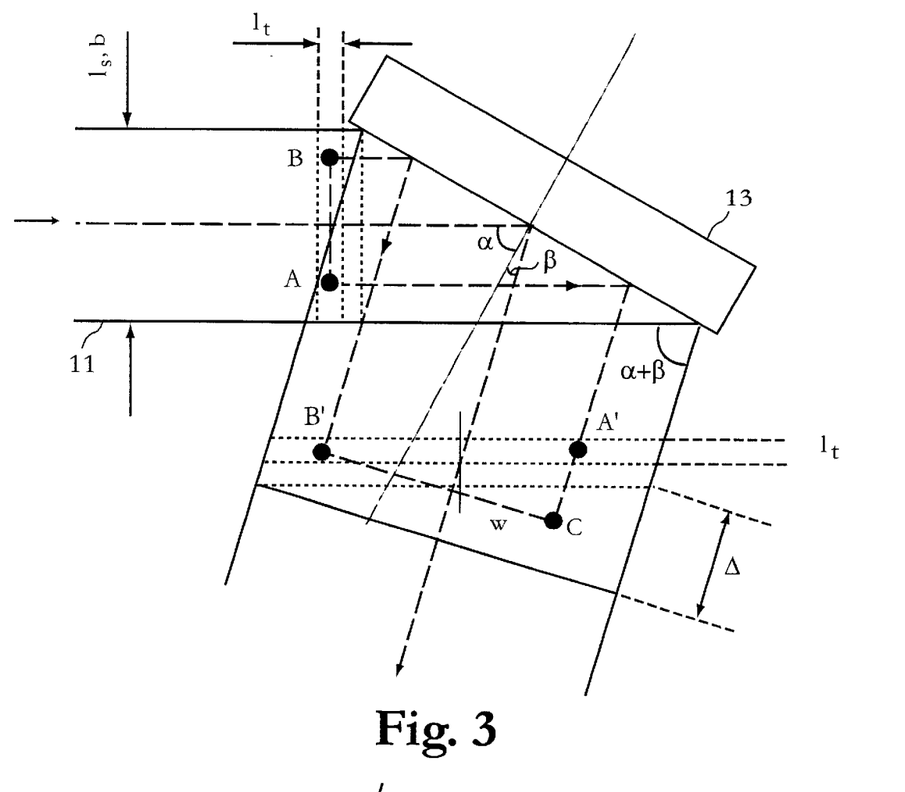
FIG. 3 illustrates, schematically, in a top view, a diffraction grating as being comprised in the device of FIG. 2, and visualizes the principles of spatial coherence length reduction according to the present invention.
Figure 4:
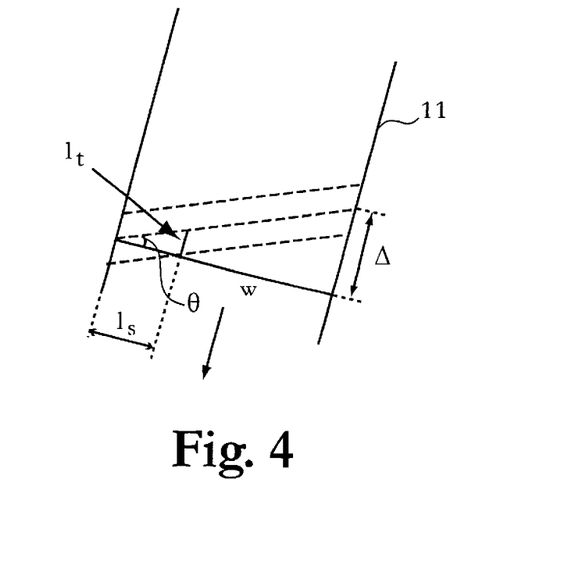
FIG. 4 illustrates temporal and spatial coherent lengths of a radiation beam diffracted by the grating of FIG. 3.

Turning now to FIGS. 3 and 4, which illustrate the principles of spatial coherence length reduction according to the present invention, the optical phase of two points A and B is assumed to be correlated, i.e. the light in points A and B is correlated. Following the light in points A and B along the path of beam 11 it can be seen that the light from the two points drift apart longitudinally, i.e. in the propagation direction of beam 11, and after diffraction by grating 13 the light from point B will be further ahead in beam 11, i.e. at point B', than light from point A, now at point A'. The light in B' is propagating simultaneously with light in point C, which was emitted from the laser source earlier than light in B'.

The spatial coherence length (i.e. across the diffracted laser beam) has obviously decreased while the temporal coherence length is unaltered (but the coherence length in the propagation direction of the diffracted beam is increased). If the transverse beam lag is long compared to the temporal coherence length, the spatial coherence length across the diffracted beam will approach the temporal coherence length of the diffracted beam.

Assuming now that the laser beam is incident on the grating according to FIG. 1 and the incident angle is denoted by $\alpha$ and the diffraction angle is denoted by $\beta$. Further, assuming that the incident laser beam is spatially coherent across the complete width (coherence length $l_s$) and that the temporal coherence length is $l_t$, a coherence cell can be defined having sides $l_s$ and $l_t$.

The grating introduces a transverse time lag or delay across the beam as indicated by A in FIG. 3. The magnitude of the lag is determined by the grating properties and the incident and exit (diffraction) angles according to $$\Delta = b(\sin \alpha - \sin \beta)/\cos \alpha \qquad (2)$$

where b is the incident beam width.

The angles $\alpha$ and $\beta$ are related by the grating equation:

$$\sin \alpha + \sin \beta = \lambda/d \qquad (3)$$

where $\lambda$ is the wavelength of the laser beam light and d is the groove spacing of the grating.

The output beam width w is given by (4)

$$w = b(\cos \beta/\cos \alpha) \qquad (5)$$

The magnification M of the beam width is given by $$M = w/b \quad (6)$$

The lag $\Delta$ may now be written as $$\Delta = w\lambda/(d \cos \beta) \quad (7)$$

A rough estimation of the expected change in coherence properties when the beam is diffracted from the grating 13 is as follows. The coherence cells become tilted relative to the propagation direction of the diffracted beam. A "skew" angle $\theta$ can be defined as (see FIG. 4)

$$\tan \theta = \Delta/w \quad (8)$$

But this angle may also be expressed in terms of the coherence lengths $$\tan \theta = l_t/l_s \quad (9)$$

We have thus $$l_s/l_t = w/\Delta = (\sin \alpha - \sin \beta)/\cos \alpha \quad (10)$$

The coherence length across the diffracted laser beam is determined by the incident and exit angles and the initial temporal coherence length of the laser beam.

The concept of the diffraction grating induced coherence length reduction has been verified experimentally on four different KrF excimer lasers. Using the diffraction grating the coherence length across the diffracted beam was shown to decrease down to the same order of magnitude as the temporal coherence length of the laser.

Figure 5A:
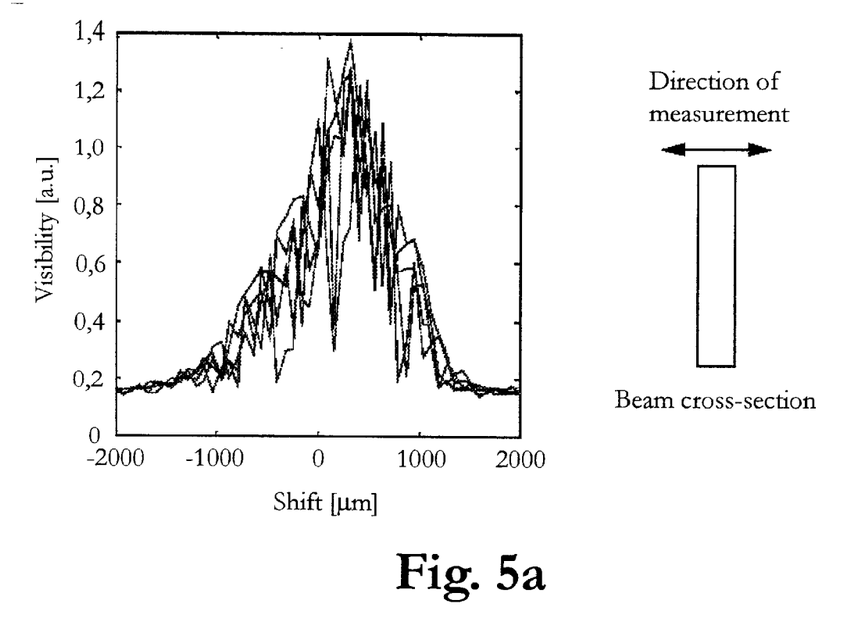
FIGS. 5a–b are diagrams illustrating a fringe visibility function across the short dimension of a laser beam having a rectangular cross section before and after having been diffracted by a diffraction grating, respectively, wherein the spatial coherence length reduction obtained by the grating is easily observable.
Figure 5B:
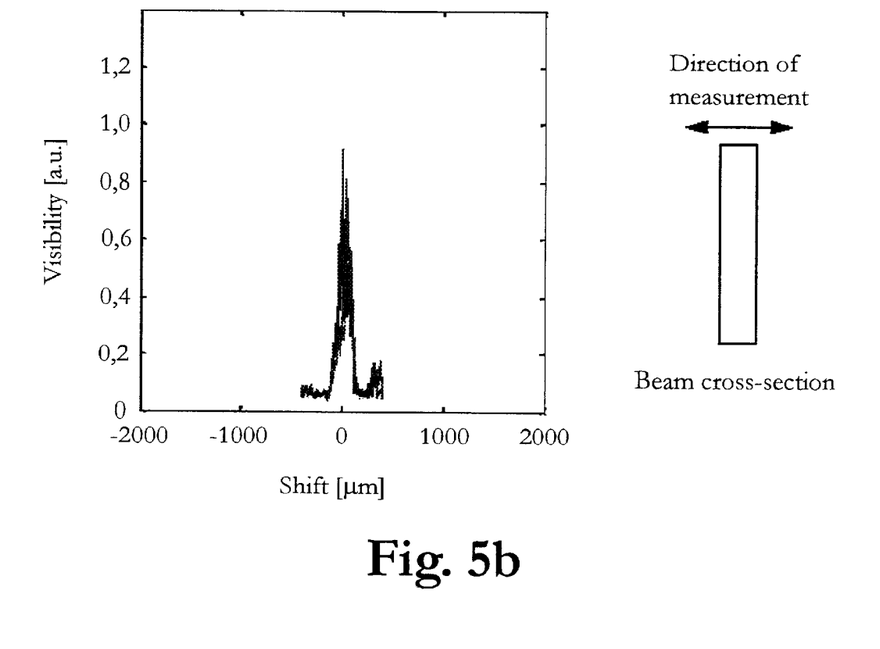

In FIGS. 5a–b are shown the fringe visibility function across the short dimension of a rectangular laser beam from a Lambda Physik, Nova Line Compact laser without and with use of the diffraction grating for reducing the coherence length across the beam. The fringe visibility function, which is a measure of the spatial coherence, is measured with an interferometer. The beam is splitted, sheared and recombined. At smaller shear are strong interference fringes, i.e. high fringe visibility. Large shear covers the visibility of the fringes. The visibility versus shear (shift) shows the spatial coherence length of the beam. The traces represent five consecutive measurements across the beam. Comparison between FIGS. 5a and 5b shows a remarkable decrease of the spatial coherence length when a grating is used.

Further, several grating configuration designs may be used in the present invention. The most efficient configuration as regards diffraction efficiency is to use the grating in Littrow configuration, i.e. the beam is diffracted back along the incident beam. Such configuration is, however, not practical, but very high efficiency can also be achieved if the angle between the incident and diffracted beams is small, say less than 20 degrees. In such a case, there will be a slight anamorphic magnification of the beam. A suitable grating having 3600 grooves/mm is commercially available from Spectrogon, Sweden. However, if the incident laser beam cross section is rectangular with the longer side twice as long as the shorter one, and the diffracted beam shall have a quadratic cross-section, this magnification is not sufficient, and thus a separate anamorphic component is needed.

Another configuration, which provides for an anamorphic magnification of two and fairly high efficiency is to use a very high groove frequency grating, e.g. 4200 grooves/mm.

It shall be appreciated that as an alternative to the reflection grating of FIGS. 2–3 a transmission grating may be used. The discussion above holds true for a transmission grating mutatis mutandis.

It shall further be appreciated that as an alternative to the lenses of FIG. 2 reflecting optics may be used. The array of lenses 15 can be realized by means of an array of mirrors.

Still a further alternative is to use Fresnel diffraction components in the homogenizer instead of, or as a complement to, refracting and reflecting optics.

In the case of using a transmission grating together with an array of Fresnel lenses these components could be provided on opposite surfaces of a single substrate.

The present invention has so far been described as reducing the coherence length across the laser beam in one direction only (the horizontal direction), whereas no reduction has been obtained in the orthogonal direction. In a typical case this performance is acceptable. The coherence length is reduced along the shorter dimension as this direction is the critical one; the spatial coherence length relative to the beam width is much larger. Nevertheless, there may be applications where the coherence length has to be reduced in two orthogonal directions across the laser beam. This may be achieved in any of following manners.

A second diffraction grating may be provided in the laser beam path upstream of the homogenizer, and be oriented to diffract the beam in a plane (vertical plane) orthogonal to the plane, in which the grating of FIG. 2 is diffracting the beam (horizontal plane). It is advantageous to place the second grating close to a Fourier plane relative to the first grating. Thus, imaging optics is suitably arranged between the two gratings.

Alternatively, the beam is splitted into two portion by means of a beamsplitter or similar, wherafter the two beams are diffracted in orthogonal planes and thereafter superimposed. Preferably the path lengths of the two beams are different.

Figure 6:
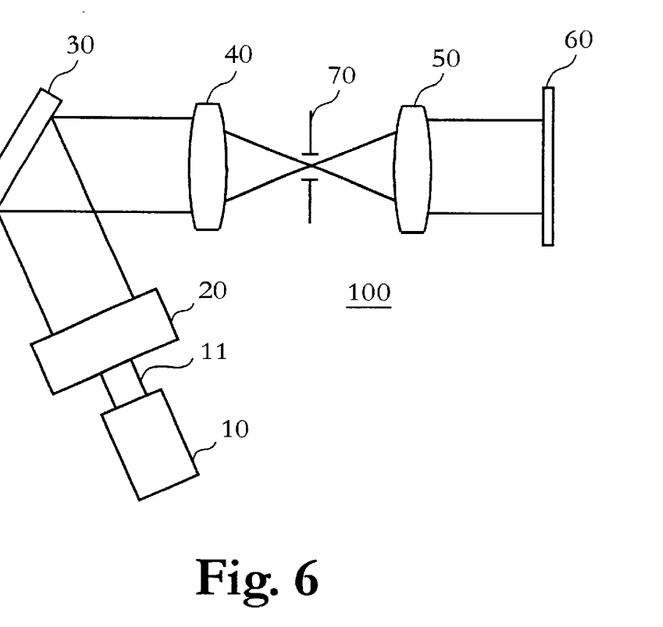
FIG. 6 illustrates, schematically, in a top view, an apparatus for high precision printing of surface patterns on photosensitive surfaces of workpieces, such as photomasks for semiconductor devices and displays, comprising an inventive device for radiation beam homogenization.

Referring next to FIG. 6, a pattern generator 100 comprises an SLM 30 having multitude of modulating elements with individual and multi-value pixel addressing, an illumination source 10, an illumination beam scrambling device 20, an imaging optical system 40, 70, 50, and a fine positioning substrate stage 60 with an interferometer position control system and a hardware and software data handling system for the SLM (not explicitly illustrated). A workpiece having a photosensitive surface, such as a photomask, is placed on the substrate prior to pattern generation.

The illumination source 10 in the pattern generator is a KrF excimer laser giving a 10–20 nanoseconds long light flash in the UV region at 248 nanometer wavelength with a bandwidth corresponding to the natural linewidth of the excimer laser. In order to avoid pattern distortion on the substrate, the light from the excimer laser is uniformly distributed over the SLM surface and the light has a short enough coherence length not to produce laser speckle on the substrate.

A beam scrambler or conditioner 20 is used to achieve these two aims. It divides the beam from the excimer laser in several beam paths with different path length and then adds them together in order to reduce the spatial coherence length. The beam scrambler includes also, or instead, a coherence reducer and a beam homogenizer consisting of the device as illustrated in FIG. 2 giving a "top-hat" light distribution. Alternatively, any of the other embodiments of the inventive homogenizer as described above may be employed in the pattern generator 100.

The beam scrambler or conditioner 20 may comprise further optics such as e.g. a diffuser, a beam shaping device, e.g. a beam expander, a field stop aperture 450, an illuminator stop having an illuminator stop aperture, and a relay of lenses.

The light from the SLM is relayed and imaged down to the substrate on the workpiece. This is performed using a Schlieren optical projection system, see U.S. Pat. No. 6,285,488 by Sandström and references therein, all of which being hereby incorporated by reference.

An electronic data delivery system is loaded with a digital description of the pattern to be printed; extracts a sequence of partial patterns from the digital pattern description; converts the partial patterns to modulator signals; and feeds the signals to the modulator. The precision mechanical system moves the workpiece relative to the projection system; and an electronic control system coordinates the movement of the workpiece, the feeding of the signals to the modulator and the emitted radiation, so that a large pattern is stitched together from the partial images created by the sequence of partial patterns.

For further details of pattern generators of this kind reference is made to the above-mentioned U.S. Pat. No. 6,285,488 and to U.S. patent application Ser. No. 09/765,084, which application is hereby incorporated by reference.

Figure 7:
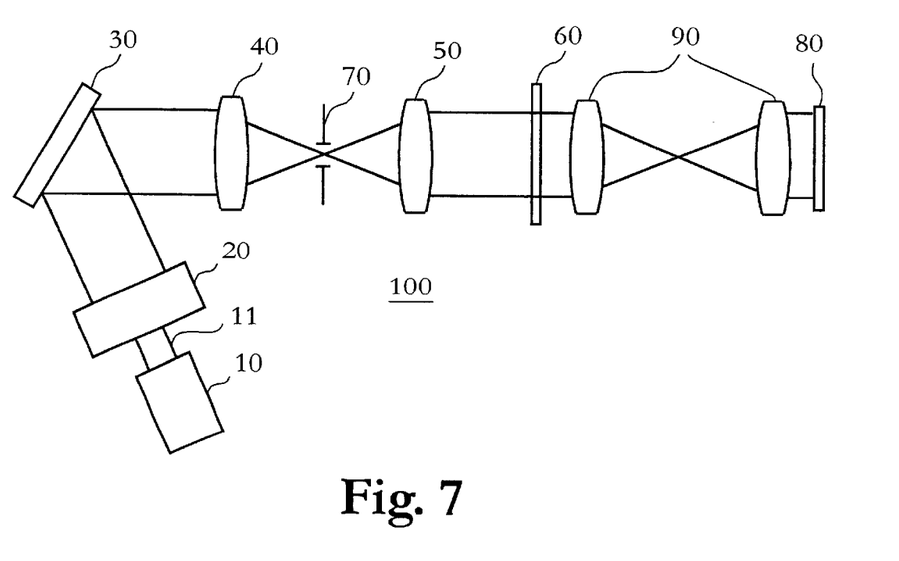
FIG. 7 illustrates, schematically, in a top view, an apparatus similar to FIG. 6, but arranged for inspection.

FIG. 7 illustrates, schematically, in a top view, an apparatus 100 similar to FIG. 6, but arranged for inspection of a surface pattern on a workpiece 60. The FIG. 7 apparatus comprises a source 10 configured to emit a spatially coherent radiation beam; a radiation beam conditioning device 20 configured to shape and homogenize the spatial intensity distribution the radiation beam; a spatial light modulator 30 having multitude of modulating elements, the spatial light modulator 30 being illuminated by the conditioned radiation beam; and a projection system 40, 70, 50 to create an image of the spatial light modulator on the photosensitive surface of the workpiece 60.

The apparatus further comprises a camera 80 provided with suitable imaging optics 90 for inspection of the image of the spatial light modulator as created on the surface of the workpiece 60.

The radiation beam-conditioning device 60 includes a device for homogenizing a spatially coherent radiation beam according to any of the embodiments of the present invention as described above.

Further embodiments of the device for homogenizing a spatially coherent radiation beam according to the present invention will next be described with reference to FIGS. 8a–e.

The spatial coherence of a beam can be reduced by the use of a micro mirror array. A micro mirror array is a device were a large number of small reflecting surfaces have been fabricated on a larger substrate with the normals of the micro mirror surfaces oriented at an angle with respect to the normal of the substrate surface. The micro mirror width d is much smaller than the substrate width.

Figure 8A:
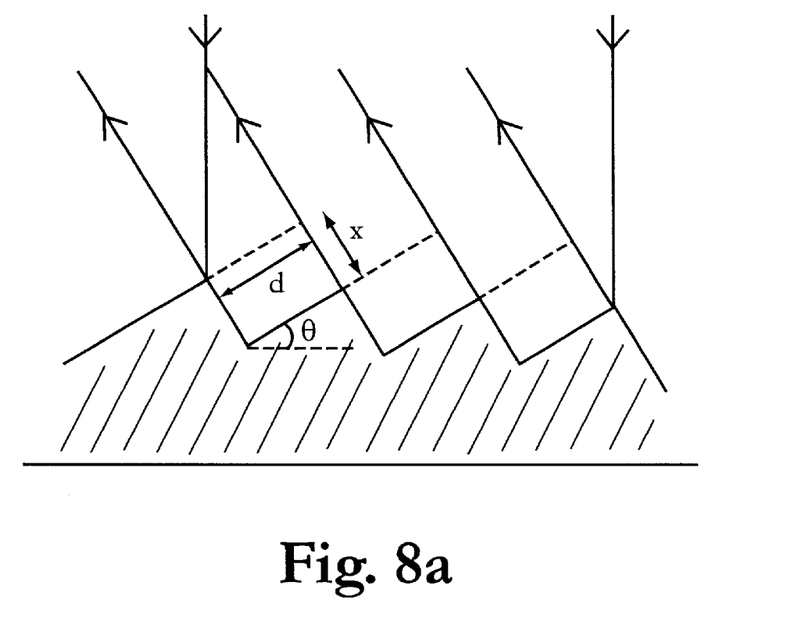
FIG. 8a illustrates in a side view the use of a micro mirror array as being comprised in a device for homogenizing a spatially coherent radiation beam according to a further embodiment of the present invention.

An incoming beam will upon reflection (not diffraction) on the micro mirror surfaces be divided into smaller sub beams where a wave front lag X between adjacent sub beams relative to the incoming beam has been introduced. The wave front lag X is described by $$X = \frac{d}{\tan(\phi)} \quad (11)$$

where $\phi$ is the tilt angle of the micro mirror and d is the width of the micro mirror, see FIG. 8a. The spatial coherence of the reflected beam will thus be limited to the micro mirror width d even if the spatial coherence length of the incoming beam is larger than d.

A micro mirror array device can be fabricated with the micro mirrors placed in a pattern on the surface and oriented for a common reflection direction such that the spatial coherence in two orthogonal directions of the incoming beam cross section can be reduced. The concept is schematically illustrated in FIG. 8e.

Such a device can be produced in a number of ways: diamond machining, hot pressing of plastics, assembly of small prisms, or selective etching of a crystalline silicon.

An well-designed method is by preferential etching of silicon or similar crystalline material. A silicon wafer with 1-1-1 orientation produces square structures when etched in a solution, which etches preferentially. An example of such a solution is potassium hydroxide, but other etchants known in the art are equally suitable. A photoresist pattern is produced that protects certain areas and exposes other to the etchant. Design methods for the resist pattern are known in the art.

Figure 8B:
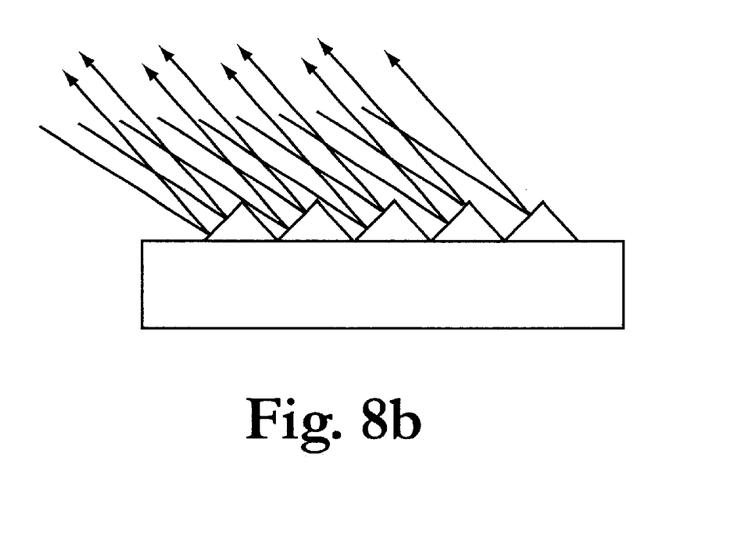
FIGS. 8b–e illustrate in a side view, in a top view, in a view from the angle of incident light and in a perspective view, respectively, the use of a two-dimensional micro mirror array as being comprised in a device for homogenizing a spatially coherent radiation beam according to still a further embodiment of the present invention.
Figure 8C:
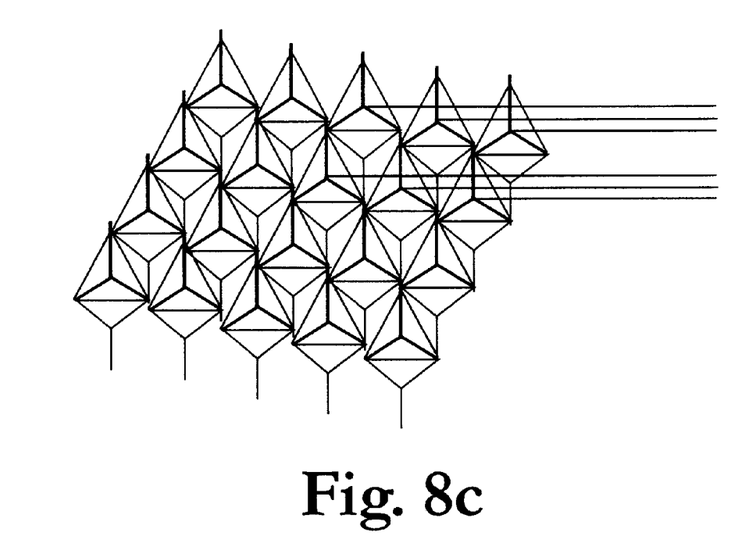
Figure 8D:
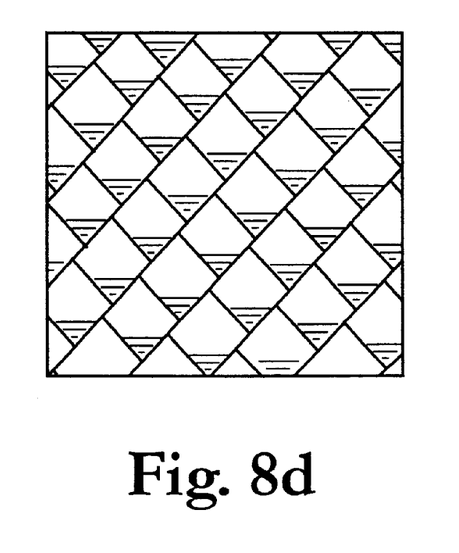
Figure 8E:
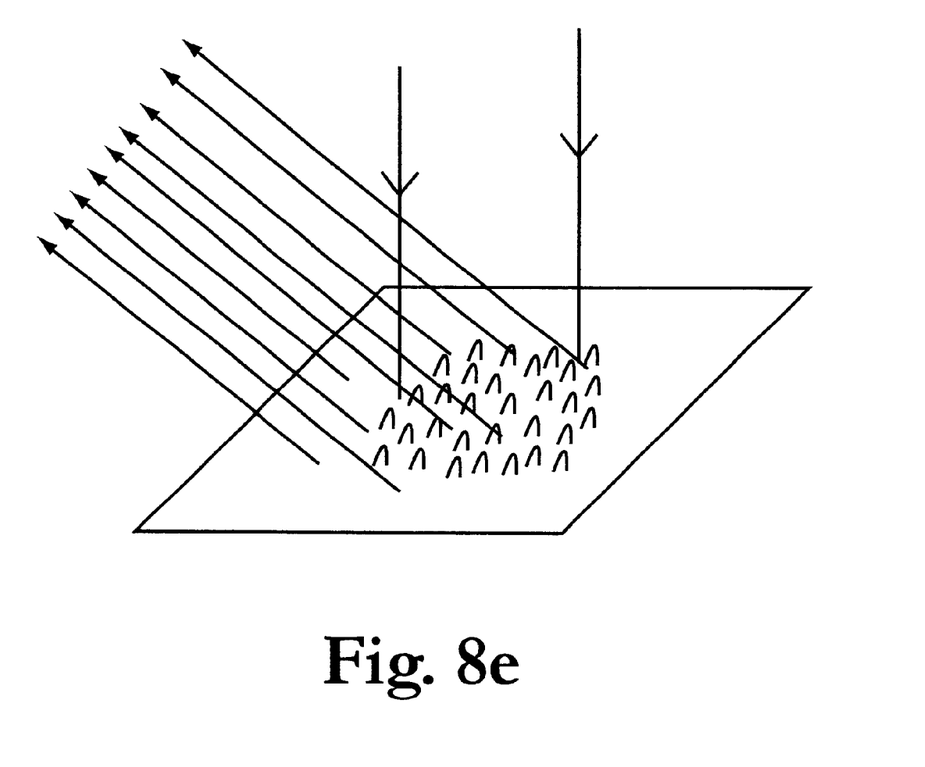

FIGS. 8b–d shows a pattern produced by preferential etching of silicon with 1-1-1 orientation. The facet surfaces are determined by the crystal directions of the crystal, and are therefore flat and parallel to each other. The facets are displaced relative to the their neighbours in both directions. With a properly designed device any facet is displaced in the propagation direction by half a temporal coherence length or preferably more from its neighbours. One half a coherence length displacement in the propagation direction adds one coherence length delay. Light reflected from one facet will then be interfering weakly or not at all with the light reflected from the neighbour facet.

Facets that are not in the vicinity of each other can have the same delay since they are not coherent in the incident beam. The two-dimensional device in a reflecting configuration operates better in the direction parallel to the plane of incidence than in that perpendicular to said plane. Therefore the most effective direction is preferably oriented in the direction of the beam that has the highest need of coherence destruction.

The discussion above concerning micro mirror arrays is, mutatis mutandis, equally valid also for refractive optics.

What is claimed is:

1. A device for homogenizing the spatial intensity distribution of a spatially coherent radiation beam comprising:
    a grating arranged in the propagation path of said spatially coherent radiation beam to diffracting said coherent beam and thus decreasing the spatial coherence length of a diffracted radiation beam in a direction orthogonal to the propagation direction of the radiation beam relative to the width of the radiation beam in said orthogonal direction; and
    a radiation splitting and directing arrangement arranged in the propagation path of said diffracted radiation beam to split said diffracted radiation beam into spatially separated portions and to superimpose said spatially separated portions to thereby form a radiation beam having a homogenized spatial intensity distribution.

2. The device of claim 1 wherein said spatially separated portions have each a cross-sectional width, which is shorter than the spatial coherence length of said radiation beam.

3. The device of claim 1 wherein said spatially separated portions have each a cross-sectional width, which is longer, preferably much longer, than the spatial coherence length of said diffracted radiation beam in said orthogonal direction, to thereby prevent adjacent portions from interfering with each other while being superimposed.

4. The device of claim 1 wherein said spatially coherent radiation beam is temporally coherent and has a temporal coherence length, which is shorter then its spatial coherence length at the position of the grating.

5. The device of claim 4 wherein said grating is adapted for decreasing the coherence length of the diffracted radiation beam in said orthogonal direction to about the same magnitude as the temporal coherence length of the diffracted radiation beam.

6. The device of claim 1 wherein said diffracted radiation beam is of $1^{st}$ order.

7. The device of claim 1 wherein said grating is a transmission grating.

8. The device of claim 1 wherein said grating is a reflection grating.

9. The device of claim 8 wherein said grating is arranged in Littrow configuration.

10. The device of claim 1 wherein said radiation beam has a rectangular cross section, and said grating is arranged to magnify said radiation beam in one direction to thereby obtain a diffracted radiation beam of a substantially quadratic cross section.

11. The device of claim 1 wherein said splitting and directing arrangement includes an array of lenses, each of which refracts a respective one of said spatially separated portions, and a lens arrangement for imaging the spatially separated portions onto each other.

12. The device of claim 11 wherein said splitting and directing arrangement includes a first and a second array of cylindrical lenses, each of the lenses of the first array refracting a respective one of said spatially separated portions in a first direction and each of the lenses of the second array refracting a respective one of said spatially separated portions in a second direction, said first and second directions being orthogonal, to thereby allow for different magnification of said spatially separated portions in said first and second directions.

13. The device of claim 12 wherein said splitting and directing arrangement includes a third and a fourth array of cylindrical lenses, each of the lenses of the second array refracting a respective one of said spatially separated portions in said first direction and each of the lenses of the fourth array refracting a respective one of said spatially separated portions in said second direction, the lenses of said third array being positioned in or near the focal plane of the lenses of said first array and the lenses of said fourth array being positioned in or near the focal plane of the lenses of said second array, to thereby avoid diffraction patterns from the edges of the lenses of the first and second arrays.

14. The device of claim 1 wherein said splitting and directing arrangement includes an array of mirror elements, each of which reflects a respective one of said spatially separated portions.

15. The device of claim 1 wherein said splitting and directing arrangement includes Fresnel diffraction components.

16. The device of claim 1 wherein said device further comprises a radiation beam expander arranged in the propagation path of said radiation beam upstream of said grating for expanding said radiation beam.

17. A radiation beam conditioning device for use in an apparatus for high precision printing or inspection of a surface pattern on a photosensitive surface of a workpiece, particularly a photomask for semiconductor devices and displays, using a spatially coherent radiation beam, said conditioning device comprising a radiation beam homogenizer to homogenize the spatial intensity distribution of said spatially coherent radiation beam, the homogenizer including a grating arranged in the propagation path of said spatially coherent radiation beam to diffract said coherent beam and thus decreasing the coherence length of a diffracted radiation beam in a direction orthogonal to the propagation direction of the radiation beam relative to the width of the radiation beam in said orthogonal direction; and a radiation splitting and directing arrangement arranged in the propagation path of said diffracted radiation beam to split said diffracted radiation beam into spatially separated portions and to superimpose said spatially separated portions to thereby form a radiation beam having a homogenized spatial intensity distribution.

18. The radiation beam conditioning device of claim 17 wherein said spatially separated portions have each a cross-sectional width, which is longer, preferably much longer, than the coherence length of said diffracted radiation beam in said orthogonal direction, to thereby prevent adjacent portions from interfering with each other while being superimposed.

19. An apparatus for high precision printing or inspection of a surface pattern on a photosensitive surface of a workpiece, particularly a photomask for semiconductor devices and displays, comprising a source configured to emit a spatially coherent radiation beam;

a radiation beam conditioning device configured to shape and homogenizing the spatial intensity distribution the radiation beam;

a spatial light modulator having multitude of modulating elements, said modulator being arranged to be illuminated by said conditioned radiation beam; and a projection system configured to create an image of the spatial light modulator on the photosensitive surface of the workpiece, wherein said radiation beam conditioning device includes a grating arranged in the propagation path of said spatially coherent radiation beam to diffract said coherent beam and thus decreasing the coherence length of a diffracted radiation beam in a direction orthogonal to the propagation direction of the radiation beam relative to the width of the radiation beam in said orthogonal direction; and a radiation splitting and directing arrangement arranged in the propagation path of said diffracted radiation beam to split said diffracted radiation beam into spatially separated portions and to superimpose said spatially separated portions to thereby form a radiation beam having a homogenized spatial intensity distribution.

20. The apparatus of claim 19 further comprising an electronic data delivery system configured to accept a digital description of the pattern to be printed or inspected; to extract a sequence of partial patterns from the digital pattern description; to convert said partial patterns to modulator signals; and to feed said signals to the modulator;

a precision mechanical system configured to move said workpiece relative to said projection system; and an electronic control system configured to coordinate the movement of the workpiece, the feeding of the signals to the modulator and the emitted radiation, so that a large pattern is stitched together from the partial images created by the sequence of partial patterns.

21. A method for homogenizing the spatial intensity distribution of a spatially coherent radiation beam, comprising the actions of:

diffracting said coherent beam and thus decreasing the coherence length of a diffracted radiation beam in a direction orthogonal to the propagation direction of the radiation beam relative to the width of the radiation beam in said orthogonal direction;

splitting said diffracted radiation beam into spatially separated portions; and superimposing said spatially separated portions to thereby form a radiation beam having a homogenized spatial intensity distribution.

22. A method for high precision printing or inspection of a surface pattern on a photosensitive surface of a workpiece, particularly a photomask for semiconductor devices and displays, comprising the actions of:

emitting a spatially coherent radiation beam;

homogenizing the spatial intensity distribution the radiation beam;

illuminating a spatial light modulator having multitude of modulating elements with said homogenized radiation beam; and creating an image of the spatial light modulator on the photosensitive surface of the workpiece by means of a projection system, wherein the step of homogenizing includes the actions of:
diffracting said coherent beam and thus decreasing the coherence length of a diffracted radiation beam in a direction orthogonal to the propagation direction of the radiation beam relative to the width of the radiation beam in said orthogonal direction;

splitting said diffracted radiation beam into spatially separated portions; and superimposing said spatially separated portions to thereby form a radiation beam having a homogenized spatial intensity distribution.

23. A device for homogenizing the spatial intensity distribution of a spatially coherent radiation beam comprising a deflection device arranged in the propagation path of said spatially coherent radiation beam to deflect said coherent beam and thus decreasing the spatial coherence length of a deflected radiation beam in a direction orthogonal to the propagation direction of the radiation beam relative to the width of the radiation beam in said orthogonal direction; and a radiation splitting and directing arrangement arranged in the propagation path of said deflected radiation beam to split said deflected radiation beam into spatially separated portions and to superimpose said spatially separated portions to thereby form a radiation beam having a homogenized spatial intensity distribution.

24. The device of claim 23 wherein said deflecting device includes a segmented mirror or a micro mirror array.

25. The device of claim 23 wherein said deflecting device includes refractive optics.

26. The device of claim 23 wherein said deflecting device includes a two-dimensional array of optical components, each displaced relative to its neighboring components, wherein said device is configured to reduce the spatial coherence length in two orthogonal directions across the beam.

* * * * *